(12) United States Patent
Kawahito et al.

(10) Patent No.: US 7,834,786 B2
(45) Date of Patent: Nov. 16, 2010

(54) SAMPLE HOLD CIRCUIT FOR USE IN TIME-INTERLEAVED A/D CONVERTER APPARATUS INCLUDING PARALLELED LOW-SPEED PIPELINE A/D CONVERTERS

(75) Inventors: Shoji Kawahito, Hamamatsu (JP); Zheng Liu, Hamamatsu (JP); Yasuhide Shimizu, Isahaya (JP); Kuniyuki Tani, Ogaki (JP); Akira Kurauchi, Kawasaki (JP); Koji Sushihara, Ikoma (JP); Koichiro Mashiko, Takarazuka (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 22 days.

(21) Appl. No.: 12/436,289

(22) Filed: May 6, 2009

(65) Prior Publication Data

US 2009/0278716 A1    Nov. 12, 2009

(30) Foreign Application Priority Data

May 8, 2008    (JP) .............................. 2008-121938

(51) Int. Cl.
    *H03M 1/10*    (2006.01)
(52) U.S. Cl. ..................... 341/120; 341/155; 341/122; 327/96; 327/94
(58) Field of Classification Search ......... 341/117–120, 341/122, 155, 172; 327/94, 96
See application file for complete search history.

(56) References Cited

U.S. PATENT DOCUMENTS

| 4,968,946 | A | * | 11/1990 | Maier | 324/671 |
| 5,705,988 | A | * | 1/1998 | McMaster | 340/628 |
| 6,304,206 | B1 | * | 10/2001 | Wada et al. | 341/162 |
| 6,380,806 | B1 | * | 4/2002 | Ang | 330/258 |
| 6,396,429 | B2 | * | 5/2002 | Singer et al. | 341/155 |
| 6,489,904 | B1 | * | 12/2002 | Hisano | 341/120 |

(Continued)

FOREIGN PATENT DOCUMENTS

JP    2003-158432    5/2003

(Continued)

OTHER PUBLICATIONS

Ken Poluton et al., "A 1-GHz 6-bit ADC System", IEEE Journal of Solid-State Circuits, vol. sc-22, No. 6, pp. 962-970, Dec. 1987.

(Continued)

*Primary Examiner*—Jean B Jeanglaude
(74) *Attorney, Agent, or Firm*—Wenderoth, Lind & Ponack, L.L.P.

(57) ABSTRACT

A sample hold circuit is provided for use in a time-interleaved A/D converter apparatus including a plurality of low-speed pipeline A/D converters which are parallelized. The sample hold circuit includes a sampling capacitor and a sample hold amplifier, and operates to sample and hold an input signal by using a switched capacitor. An adder circuit of the sample hold circuit adds a ramp calibration signal to the input signal, by inputting the ramp calibration signal generated to have a frequency identical to that of a sampling clock signal and a predetermined slope based on the sampling clock signal, into a sample hold amplifier via a calibration capacitor having a capacitance smaller than that of the sampling capacitor.

4 Claims, 11 Drawing Sheets

U.S. PATENT DOCUMENTS

| | | |
|---|---|---|
| 6,700,417 B2 | 3/2004 | Kawahito et al. |
| 6,756,928 B2 | 6/2004 | Kawahito et al. |
| 6,919,750 B2 | 7/2005 | Kawahito et al. |
| 7,227,479 B1 | 6/2007 | Chen et al. |

FOREIGN PATENT DOCUMENTS

| | | |
|---|---|---|
| JP | 2003-158434 | 5/2003 |
| JP | 2004-139268 | 5/2004 |

OTHER PUBLICATIONS

M. Gustavsson et al., "A Global Passive Sampling Technique for High-Speed Switched-Capacitor Time-Interleaved ADCs", IEEE Transactions on Circuits and Systems-II: Analog and Digital Signal Processing, vol. 47, No. 9, pp. 821-831, Sep. 2000.

Huawen Jin et al., "A Digital-Background Calibration Technique for Minimizing Time-Error Effects in Time-Interleaved ADC's", IEEE Transactions on circuits and systems-II: Analog and Digital Signal Processing, vol. 47, No. 7, pp. 603-613, Jul. 2000.

Jonas Elbornsson et al., "Blind Adaptive Equalization of Mismatch errors in a Time-Interleaved A/D Converter System", IEEE Transactions on Circuits and Systems-I: Regular papers, vol. 51, No. 1, pp. 151-158, Jan. 2004.

Steven Huang et al., "Blind Calibration of Timing Offsets for Four-Channel Time-Interleaved ADCs", IEEE Transactions on Circuits and Systems-I: Regular papers, vol. 54, No. 4, pp. 863-876, Apr. 2007.

Zheng Liu et al., "Simultaneous Compensation of RC Mismatch and Clock Skew in Time-Interleaved S/H Circuits", IEICE Transactions on Electronics, vol. E89-C, No. 6, pp. 1-8, Jun. 2006.

Zheng Liu et al., "Timing Error Calibration in Time-Interleaved ADC by Sampling Clock Phase Adjustment", Proceedings of IEEE Instrumentation and Measurement Technology Conference (IMTEC 2007), May 2007.

\* cited by examiner

SAMPLE HOLD CIRCUIT FOR USE IN TIME-INTERLEAVED A/D CONVERTER APPARATUS INCLUDING PARALLELED LOW-SPEED PIPELINE A/D CONVERTERS

BACKGROUND OF THE INVENTION

1. Field of the Invention

The present invention relates to a sample hold circuit for use in a time-interleaved A/D converter, and in particular, to a sample hold circuit for use in a time-interleaved A/D converter including a plurality of low-speed pipeline A/D converters which are parallelized, and a time-interleaved A/D converter apparatus utilizing the same sample hold circuit.

2. Description of the Related Art

A time-interleaved A/D converter including a plurality of low-speed pipeline A/D converters which are parallelized is an architecture capable of achieving high-speed sampling.

FIG. 1 is a block diagram showing a configuration of a prior art time-interleaved A/D converter, and FIG. 2 is a timing chart showing an operation of the A/D converter of FIG. 1. FIG. 3 is a timing chart showing an operation of the A/D converter of FIG. 1 when a clock skew occurs.

Referring to FIG. 1, an analog input signal Vin is inputted to a plurality M of sample hold circuits 1-1 to 1-M, and thereafter, sample and hold processing is executed based on clock signals CK1 to CKM having mutually different timings shown in FIG. 2. The output signals from the sample hold circuits 1-1 to 1-M are A/D converted by corresponding A/D converters 2-1 to 2-M, respectively, and then, A/D converted signals are outputted to a switch 3. Then, the switch 3 is sequentially switched over so as to select the output signals in an order of the A/D converters 2-1, 2-2, ..., 2-M based on a clock signal CK that is a logical sum signal of the clock signals CK1 to CKM, and a digital output signal Vout of the result of A/D conversion is outputted from the switch 3.

That is, in the case of the structure of the M channel of FIG. 1, the sample hold circuits 1-1 to 1-M of the channels perform sampling every interval Ts in accordance with the clock signals CK1, CK2, ..., CKM, respectively. Each of the sample hold circuits 1-1 to 1-M samples the analog input signal Vin when the corresponding clock signal has a high level and enters the hold phase in which the signal sampled at a low level is held. In this case, when the A/D converters 2-1 to 2-M of the M channel are used, assuming that the sampling time in one channel is Ts, then the hold time becomes (M−1)Ts. As compared with the A/D converter of only one channel that samples the analog input signal Vin in a time interval Ts/2 and holds the same in the remaining time interval Ts/2, the architecture of the time-interleaved A/D converter has such features that an increase in speed can be achieved with lower power consumption because the conversion rate per channel can be remarkably eased by prolonging the sample and hold time by M times without changing the overall conversion rate.

The prior art documents related to the present invention are as follows:

Patent Document 1: Japanese patent laid-open publication No. JP 2003-158432 A;

Patent Document 2: Japanese patent laid-open publication No. JP 2003-158434 A;

Patent Document 3: Japanese patent laid-open publication No. JP 2004-139268 A;

Patent Document 4: Specification of U.S. Pat. No. 7,227,479;

Non-Patent Document 1: Ken Poulton et al., "A 1-GHz 6-bit ADC System", IEEE Journal of Solid-State Circuits, Vol. sc-22, No. 6, pp. 962-970, December 1987;

Non-Patent Document 2: M. Gustavsson et al., "A Global Passive Sampling Technique for High-Speed Switched-capacitor Time-interleaved ADCs", IEEE Transactions on Circuits and Systems-II: Analog and Digital Signal Processing, Vol. 47, No. 9, pp. 821-831, September 2000;

Non-Patent Document 3: Huawen Jin et al., "A Digital-Background Calibration Technique for Minimizing Time-Error Effects in Time-Interleaved ADC's", IEEE Transactions on circuits and systems-II: Analog and Digital Signal Processing, Vol. 47, No. 7, pp. 603-613, July 2000;

Non-Patent Document 4: Jonas Elbornsson et al., "Blind Adaptive Equalization of Mismatch errors in a time-interleaved A/D Converter System", IEEE Transactions on circuits and systems-I: Regular papers, Vol. 51, No. 1, pp. 151-158, January 2004;

Non-Patent Document 5: Steven Huang et al., "Blind Calibration of Timing Offsets for Four-Channel Time-interleaved ADCs", IEEE Transactions on circuits and systems-I: Regular papers, Vol. 54, No. 4, pp. 863-876, April 2007;

Non-Patent Document 6: Zheng Liu et al., "Simultaneous Compensation of RC Mismatch and Clock Skew in Time-Interleaved S/H Circuits", IEICE Transactions on Electronics, Vol. E89-C, No. 6, pp. 1-8, June 2006;

Non-Patent Document 7: Zheng Liu et al., "Timing Error Calibration in Time-interleaved ADC by Sampling Clock Phase Adjustment", Proceedings of IEEE Instrumentation and Measurement Technology Conference (IMTEC 2007), May 2007.

However, since the sampling is performed practically in positions different from the ideal ones as indicated in FIG. 3 due to mismatch between channels, the clock skew occurs and becomes a factor to significantly deteriorate the performance of the time-interleaved A/D converter. When the clock skew conforms to the Gaussian distribution that has a standard deviation $\delta_{skew}$, the signal to noise and distortion power ratio (hereinafter referred to as an SNDR (Signal to Noise and Distortion Ratio)) of a time-interleaved A/D converter of M channels and a resolution of N bits are expressed by the following equation:

$$SNDR = -10\log\left(\frac{M-1}{M} \cdot \frac{1}{(2\pi f_{in}\sigma_{skew})^2} + \frac{2}{3}\frac{1}{2^{2N}}\right),$$

where fin denotes a frequency of the input signal Vin. FIG. 4 is a graph showing an SNDR [dB] with respect to a timing error [pico-second] in the A/D converter of FIG. 1. That is, FIG. 4 shows such a case that the influences of skew to the SNDRs of resolutions of 10 bits, 12 bits and 14 bits are plotted when the number M of channels is infinite and the input frequency fin is 10 MHz and 50 MHz. As apparent from FIG. 4, it can be understood that the SNDR is limited by a distortion due to the clock skew when the clock skew is large.

One method for avoiding the clock skew is to use the sample hold amplifier disclosed in the Non-Patent Document 8. Since the sample hold circuit in each channel samples the output signal from the sample hold amplifier, no clock skew occurs and no RC mismatch occurs. However, the sample hold amplifier must operate at the maximum rate thereof, and this leads to the problem of difficulties in its being applied to a high-speed and high-resolution A/D converter.

Moreover, there is also a method for passively sampling the clock skew (See, for example, the Non-Patent Document 2). However, the method has the defects that a sampling switch of a series connection is added and a tracking time is short. The timing error can be suppressed to the minimum without changing the architecture of the time-interleaved A/D converter but by calibration. The calibration in this case actually includes error detection and calibration. A calibration method on the background is now under researches due to the fact that the sampling of the clock skew is difficult during device operation.

Further, the clock skew can be measured by using a calibration signal (See, for example, the Non-Patent Document 3 and the Patent Document 4) or a so-called blind estimation method (See, for example, the Non-Patent Documents 4 and 5). If the amount of clock skew is measured, calibration can be executed by an analog method for adjusting the sampling clock phase or a digital processing method for restructuring a correct sample by using a filter bank after time-interleaved A/D conversion. Regarding the calibration of RC mismatch, sufficient researches have not been performed yet. Further, the Non-Patent Document 6 describes that RC mismatch can also be calibrated simultaneously with the clock skew by adjusting the sampling clock phase.

FIG. 5 is a circuit diagram showing a structure of a sample hold circuit 1 for use in the time-interleaved A/D converter disclosed in the Non-Patent Document 3. Referring to FIG. 5, the sample hold circuit 1 is constituted by including a differential sample hold amplifier 10 that employs a switched capacitor. In this case, Cs is a sampling capacitor, switches 21 to 26 are turned on/off by a timing signal $\phi 1$, and switches 27 to 30 are turned on/off by the inverted signal $\overline{\phi 1}$ of the timing signal $\phi 1$. Moreover, T1 and T2 are signal input terminals, T3 and T4 are signal output terminals, and T5 and T6 are reference voltage input terminals. The sample hold circuit 1 of FIG. 5 uses a method for performing digital correction of timing errors in the time-interleaved A/D converter, and the method superimposes a common mode signal on the input signal by replacing the signal into a calibration signal as shown in FIG. 5. The method is impractical because the load connected to the voltage source of the reference voltage is generally large and has had the problem of reference voltage fluctuations during the time-interleaved A/D conversion.

Moreover, the prior art blind estimation method, which needs no calibration signal, has its algorithm generally complicated and a problem that a large amount of data is necessary for convergence.

SUMMARY OF THE INVENTION

An object of the present invention is to solve the above-mentioned problems and provide a sample hold circuit capable of measuring the amount of clock skew more extremely simply and more stably than those of the prior art technique without any reference voltage source but inputting a calibration signal.

Another object of the present invention is to provide an A/D converter apparatus that employs the same sample hold circuit.

According to one aspect of the present invention, there is provided a sample hold circuit which includes a sampling capacitor and a sample hold amplifier, and which operates to sample and hold an input signal by using a switched capacitor. The sample hold circuit includes an adder circuit. The adder circuit adds a ramp calibration signal to the input signal, by inputting the ramp calibration signal generated to have a frequency identical to that of a sampling clock signal and a predetermined slope based on the sampling clock signal, into a sample hold amplifier via a calibration capacitor having a capacitance smaller than that of the sampling capacitor.

According to another aspect of the present invention, there is provided a time-interleaved A/D converter apparatus including at least two first and second sample hold circuits, at least two first and second A/D converters, a switch device, and a calculator device. Each of the sample hold circuit includes a sampling capacitor and a sample hold amplifier, and operates to sample and hold an input signal by using a switched capacitor. Each of the sample hold circuit includes an adder circuit for adding a ramp calibration signal to the input signal, by inputting the ramp calibration signal generated to have a frequency identical to that of a sampling clock signal and a predetermined slope based on the sampling clock signal, into a sample hold amplifier via a calibration capacitor having a capacitance smaller than that of the sampling capacitor. At least two first and second A/D converters A/D convert an output signal from each of the sample hold circuits. The switch device outputs an A/D converted signal obtained through A/D conversion of the input signal, by outputting output signals from the respective A/D converters at timings different from each other. The calculator device calculates a differential signal between the output signals from the respective A/D converters. When the ramp calibration signal is sampled by the sample hold circuit, the ramp calibration signal is sampled as a DC value corresponding to a clock skew amount between the sample hold circuits, and the differential signal represents the clock skew amount, thereby measuring the clock skew amount.

In the above-mentioned A/D converter apparatus, the first sample hold circuit is operated by a predetermined first sampling clock signal, and the second sample hold circuit is operated by a second sampling clock signal. In this case, the A/D converter apparatus further includes a calibration loop circuit including a delay device for adjusting a phase of the second sampling clock signal based on the differential signal so that the clock skew amount is minimized.

In addition, in the above-mentioned A/D converter apparatus, the calibration loop circuit further includes a low-pass filter, and an amplifier. The low-pass filter low-pass filters the differential signal; and the amplifier amplifies the output signal from the low-pass filter, and outputting a low-pass filtered signal to the delay device.

ADVANTAGEOUS EFFECTS OF THE INVENTION

According to the sample hold circuit of the present invention, the sample hold circuit includes the adder circuit that adds the ramp calibration signal to the input signal by inputting the ramp calibration signal generated to have a frequency identical to that of the sampling clock signal and a predetermined slope based on the sampling clock signal to the sample hold amplifier via the calibration capacitor having a capacitance smaller than the capacitance of the sampling capacitor. The calculator device calculates the differential signal between the respective output signals from the respective A/D converters. With this arrangement, the ramp calibration signal is sampled as a DC value corresponding to the amount of clock skew between the sample hold circuits when it is sampled by the sample hold circuit, and the differential signal represents the amount of clock skew, and this leads to measurement of the amount of clock skew. Accordingly, this leads to the provision of the sample hold circuit capable of measuring the amount of clock skew more extremely simply and more stably than those of the prior art technique without any reference voltage source but inputting the calibration signal. In addition, the present invention can provided the A/D converter apparatus that employs the same sample hold circuit.

Moreover, the phase of the clock signal can be adjusted so as to minimize the clock skew based on the measured clock skew. In particular, the A/D converter apparatus having the circuit for measuring the amount of clock skew includes the small calibration capacitor and the switch device that branches from the sample hold circuit. The additional calibration capacitor, which slightly increases the chip area, does not exert a large influence on the other circuit area. Therefore, a clock skew measurement circuit can be configured with an extremely small area.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
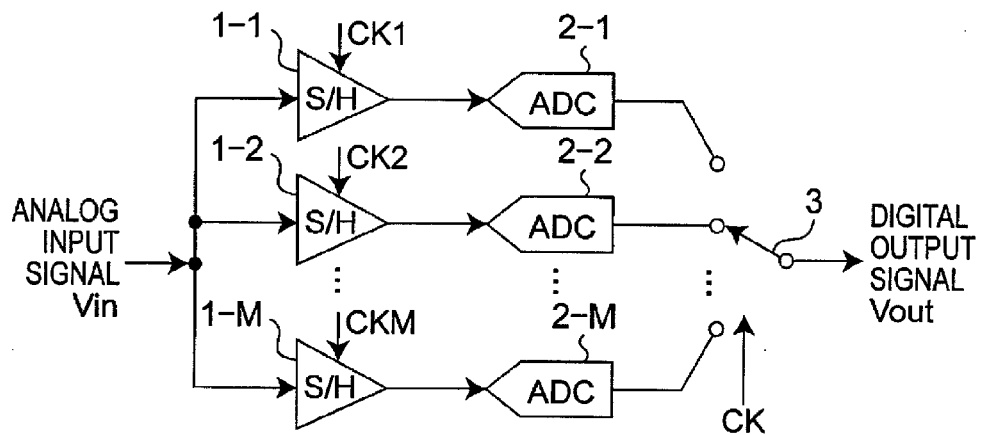
FIG. 1 is a block diagram showing a configuration of a time-interleaved A/D converter of a prior art.
Figure 2:
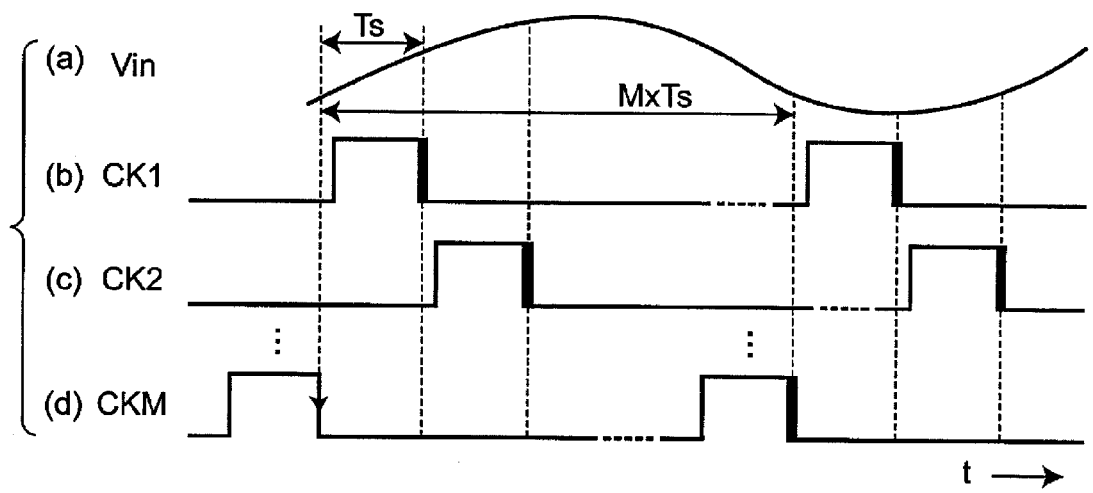
FIG. 2 is a timing chart showing an operation of the A/D converter of FIG. 1.
Figure 3:
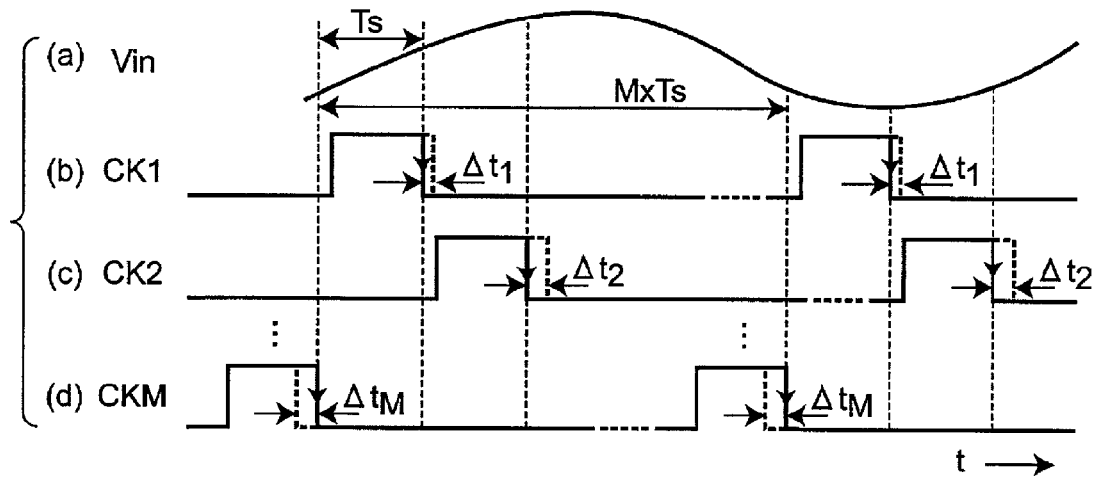
FIG. 3 is a timing chart showing an operation when the A/D converter of FIG. 1 has a clock skew.
Figure 4:
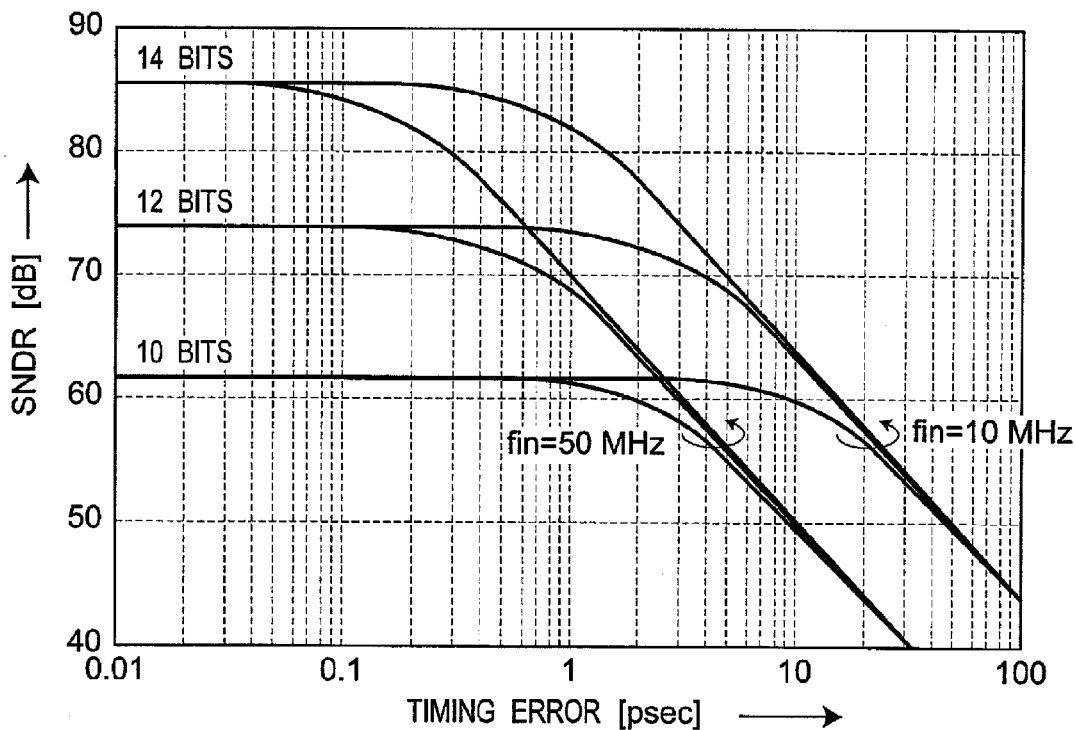
FIG. 4 is a graph showing a signal to noise and distortion ratio (SNDR) [dB] to a timing error [pico-second] in the A/D converter of FIG. 1.
Figure 5:
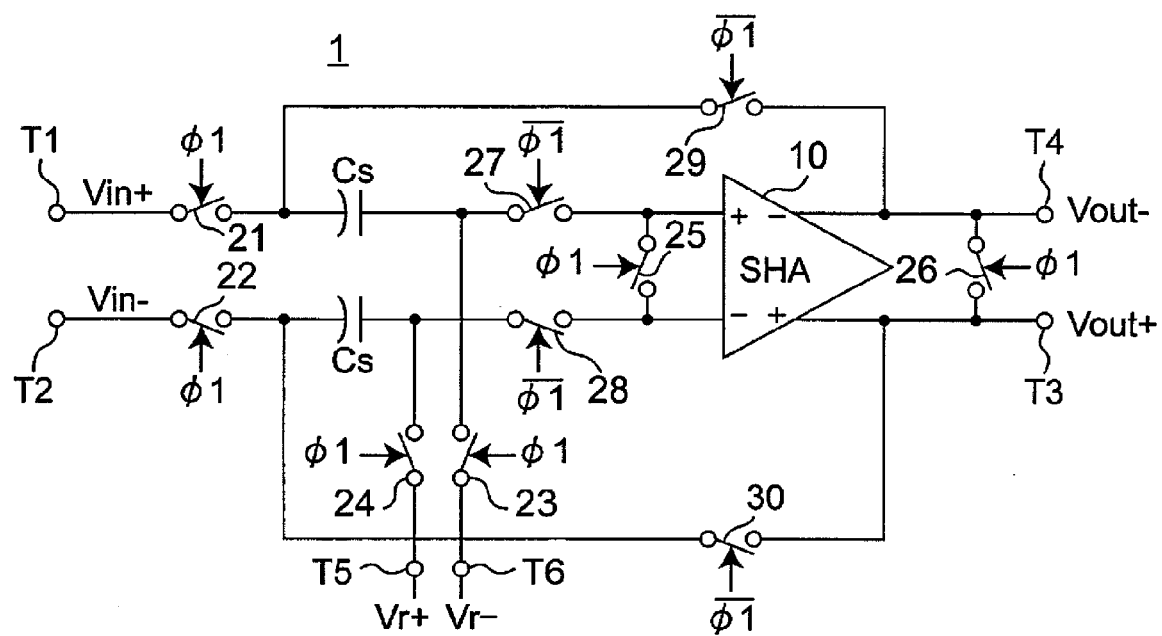
FIG. 5 is a circuit diagram showing a configuration of a sample hold circuit 1 used in the time-interleaved A/D converter disclosed in the Non-Patent Document 3.

Preferred embodiments of the present invention will be described with reference to the drawings. In the following preferred embodiments, like components are denoted by like reference numerals.

Figure 6:
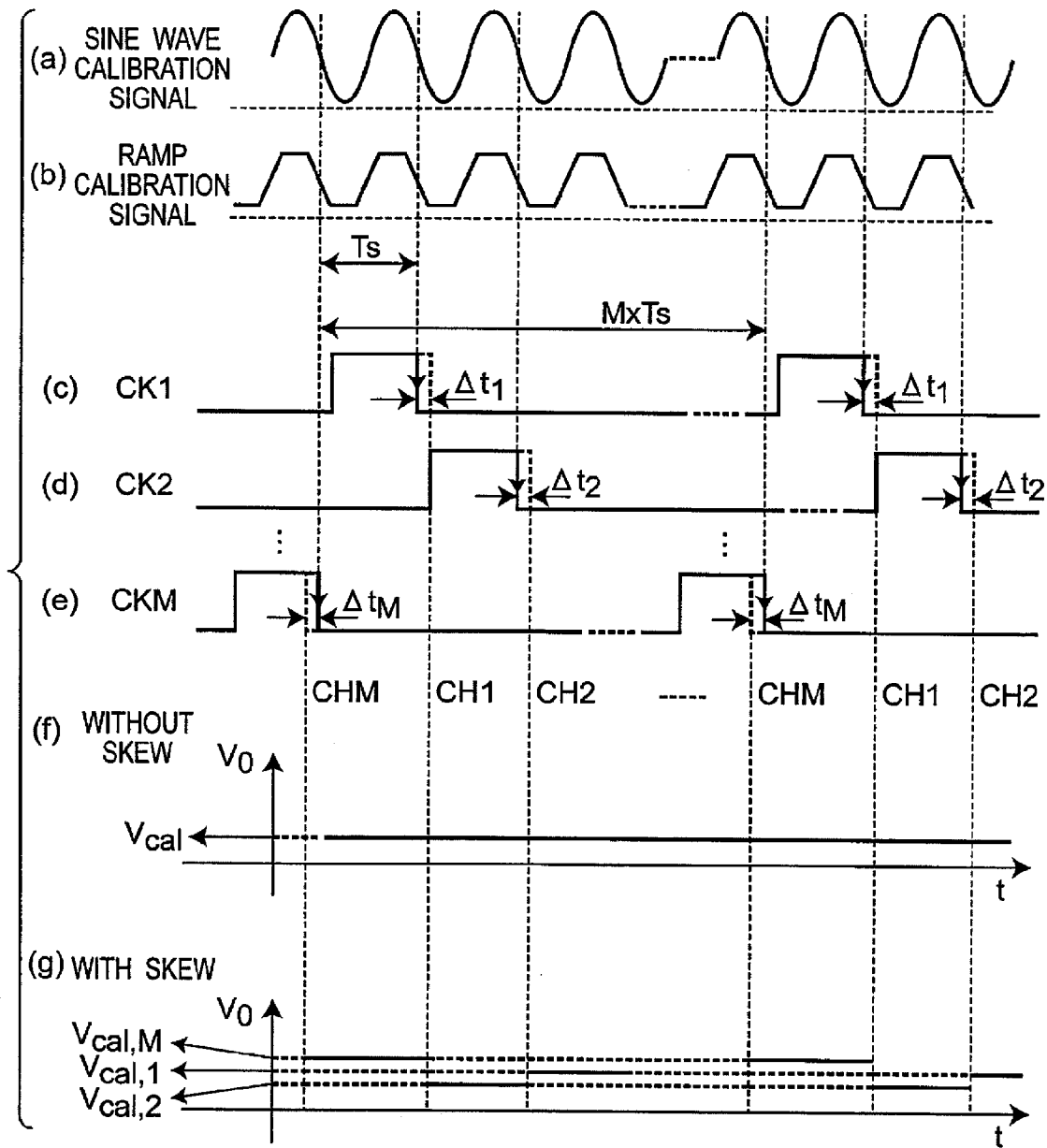
FIG. 6 is a timing chart showing an operation in the presence and absence of skew in an A/D converter according to one preferred embodiment of the present invention.
Figure 7:
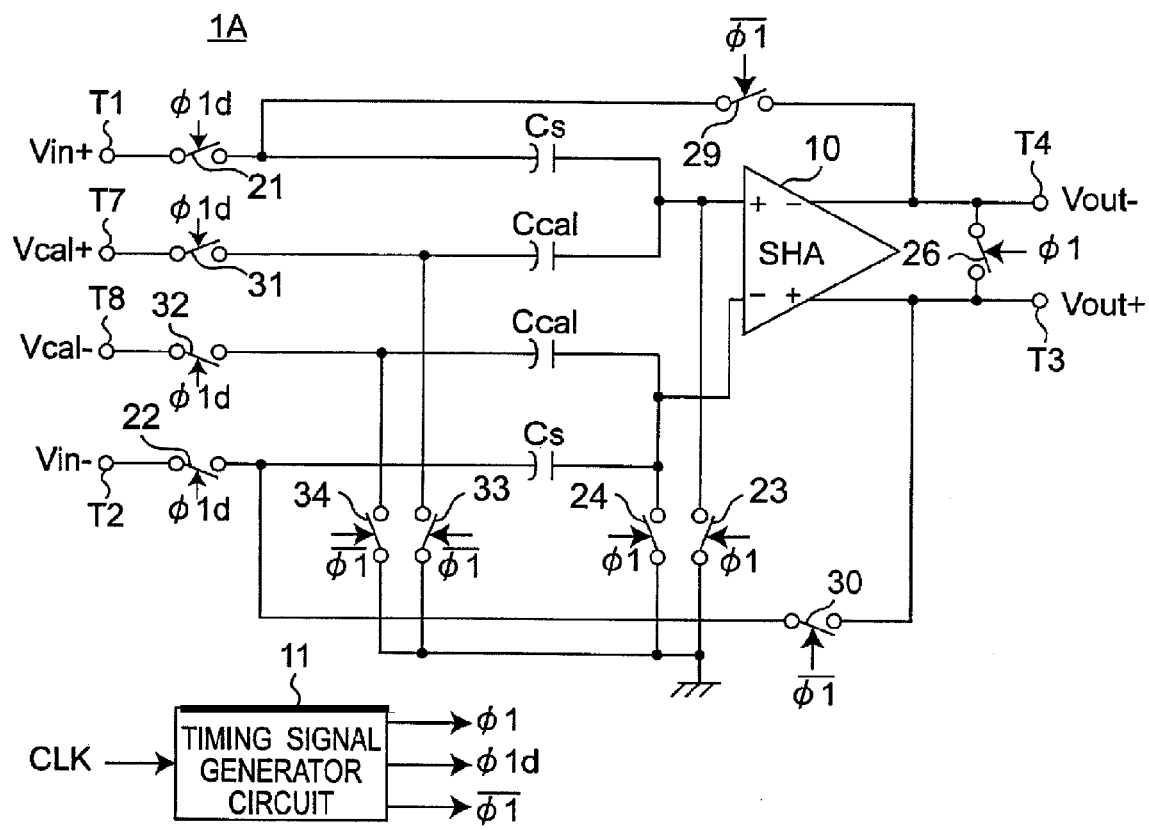
FIG. 7 is a block diagram showing a configuration of a sample hold circuit 1A for use in the A/D converter of the present preferred embodiment.
Figure 8:
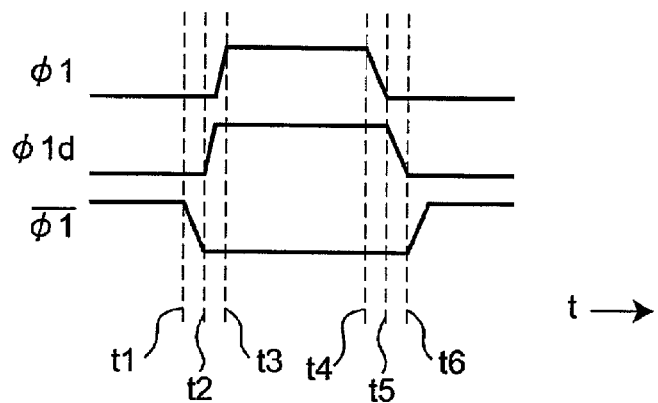
FIG. 8 is a timing chart showing timing signals $\phi$, $\phi 1d$, and $\overline{\phi 1}$ generated by the timing signal generator circuit 11 of FIG. 7.

FIG. 6 is a timing chart showing an operation in presence and absence of skew in an A/D converter according to one preferred embodiment of the present invention. FIG. 7 is a block diagram showing a configuration of a sample hold circuit 1A for use in the A/D converter of the present preferred embodiment, and FIG. 8 is a timing chart showing timing signals $\phi$, $\phi 1d$, and $\overline{\phi 1}$ generated by the timing signal generator circuit 11 of FIG. 7.

In the preferred embodiment of the present invention, a novel practical adder circuit (see FIGS. 7, 10, and 11) of a calibration signal for use in the sample hold circuit of the A/D converter apparatus. Referring to FIG. 6, a clock skew amount (in FIG. 6, Vcal,m (m=1, 2, . . . , M) is a detected voltage corresponding to the clock skew amount) is measured based on a ramp calibration signal generated based on a sine wave calibration signal (in the present preferred embodiment, the ramp calibration signal has a predetermined negative linear slope when the sine wave calibration signal is lowered). In this case, the sample hold circuit of the present preferred embodiment is characterized by including a loop circuit for self-calibrating the clock skew by adjusting the sampling clock phase by using the novel clock skew measurement method.

Next, the sample hold circuit 1A that has the novel calibration signal adder circuit of the present preferred embodiment will be described below with reference to FIG. 7. In this case, the sample hold circuit 1A includes an adder circuit that adds a (Ccal/Cs)-fold calibration signal Vcal to an analog input signal Vin as described in detail later.

Referring to FIG. 7, the sample hold circuit 1A is constituted by including a switched capacitor, and includes a sample hold amplifier 10 that is a fully-differential operational amplifier, two sampling capacitors Cs, two calibration capacitors Ccal, switches 21-24, 26, and 29-34 that are controlled to be turned on and off by clock signals $\phi 1$, $\phi 1d$, and $\overline{\phi 1}$, and a timing signal generator circuit 11. The analog input signal Vin is inputted to input terminals T1 and T2. A non-inverted signal Vin+ of the analog input signal Vin is inputted to the input terminal T1, and an inverted signal Vin− is inputted to the input terminal T2. The input terminal T1 is connected to a non-inverted input terminal of the sample hold amplifier 10 via a switch 21 that is controlled to be turned on and off by the clock signal $\phi 1d$ and the sampling capacitor Cs and connected to an inverted output terminal of the sample hold amplifier 10 via the switch 21 and a switch 29 that is controlled to be turned on and off by the clock signal $\overline{\phi 1}$. The input terminal T2 is connected to an inverted input terminal of the sample hold amplifier 10 via the switch 22 that is controlled to be turned on and off by the signal $\phi 1d$ and the sampling capacitor Cs and connected to a non-inverted output terminal of the sample hold amplifier 10 via the switch 22 and a switch 30 that is controlled to be turned on and off by the clock signal $\overline{\phi 1}$.

The ramp calibration signal Vcal is generated by the ramp calibration signal generator circuit 9 of FIG. 9 described in detail later based on the sampling clock signal CLK, and thereafter, it is inputted to input terminals T7 and T8. A non-inverted signal Vcal+ of the ramp calibration signal Vcal is inputted to the input terminal T7, and an inverted signal Vcal− is inputted to the input terminal T8. The input terminal T7 is connected to the non-inverted input terminal of the sample hold amplifier 10 via the switch 31 that is controlled to be turned on and off by the clock signal φ1d and the calibration capacitor Ccal, to be grounded via the switch 31 and the switch 33 that is controlled to be turned on and off by the clock signal $\overline{\varphi 1}$. It is noted that the non-inverted input terminal of the sample hold amplifier 10 is grounded via the switch 23 that is controlled to be turned on and off by the clock signal φ1. The input terminal T8 is connected to the inverted input terminal of the sample hold amplifier 10 via the switch 32 that is controlled to be turned on and off by the clock signal Old and the calibration capacitor Ccal, to be grounded via the switch 32 and the switch 34 that is controlled to be turned on and off by the clock signal $\overline{\varphi 1}$. It is noted that the inverted input terminal of the sample hold amplifier 10 is grounded via the switch 24 that is controlled to be turned on and off by the clock signal φ1.

The non-inverted output terminal of the sample hold amplifier 10 is connected to an output terminal T3 and connected to the inverted output terminal of the sample hold amplifier 10 via the switch 26 that is controlled to be turned on and off by the clock signal φ1. The inverted output terminal of the sample hold amplifier 10 is connected to an output terminal T4. The timing signal generator circuit 11 generates the three clock signals φ1, φ1d, and $\overline{\varphi 1}$ shown in FIG. 8 based on the sampling clock signal CLK. Referring to FIG. 8, the clock signal $\overline{\varphi 1}$ falls at a timing t1, then the clock signal φ1d rises at a timing t2, and the clock signal φ1 rises at a timing t3. Further, the clock signal φ1 falls at a timing t4, then the clock signal φ1d falls at a timing t5, and the clock signal $\overline{\varphi 1}$ rises at a timing t6. In this case, the switches 21-24, 26, and 30-34 are high-active switches, which are turned on at a high level and turned off at a low level.

Figure 9:
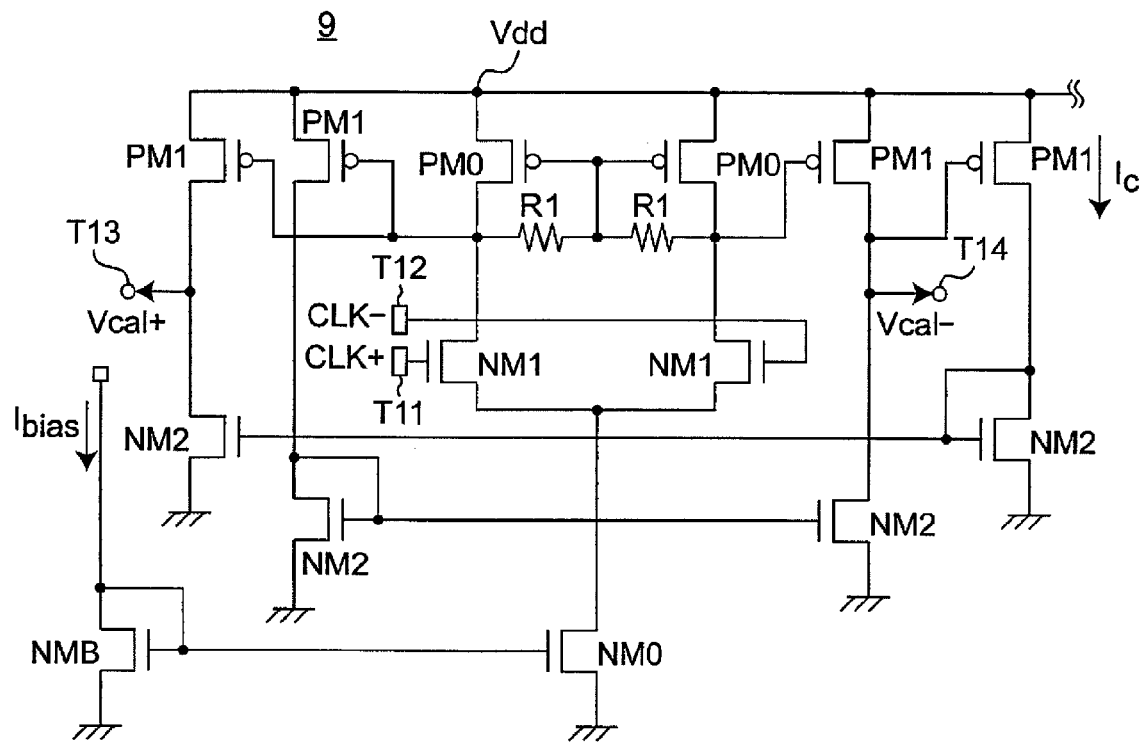
FIG. 9 is a circuit diagram showing a configuration of a ramp calibration signal generator circuit 9 for use in the sample hold circuit 1A of FIG. 7.

FIG. 9 is a circuit diagram showing a configuration of the ramp calibration signal generator circuit 9 for use in the sample hold circuit 1A of FIG. 7. Referring to FIG. 9, the ramp calibration signal generator circuit 9 is constituted by including a fully-differential amplifier that operates as a current source and a current linear decreasing power source and generates the ramp calibration signals Vcal+ and Vcal− that have a linear slope So during decreasing as shown in, for example, FIG. 12(a) and charge the calibration capacitors Ccal based on the sampling clock signals CLK+ and CLK−.

Figure 10:
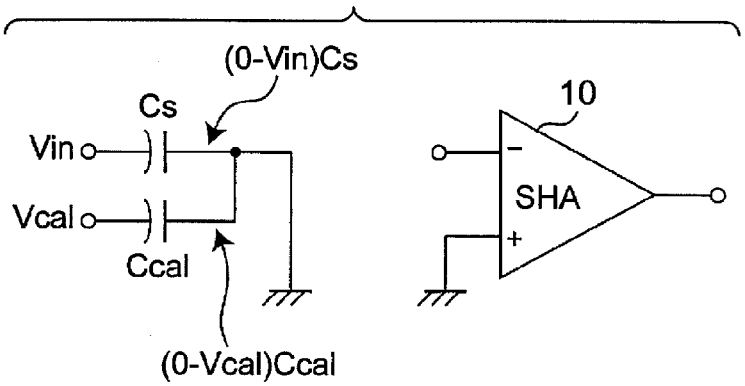
FIG. 10 is a schematic circuit diagram showing an operation in the sampling phase of the sample hold circuit 1A of FIG. 7.
Figure 11:
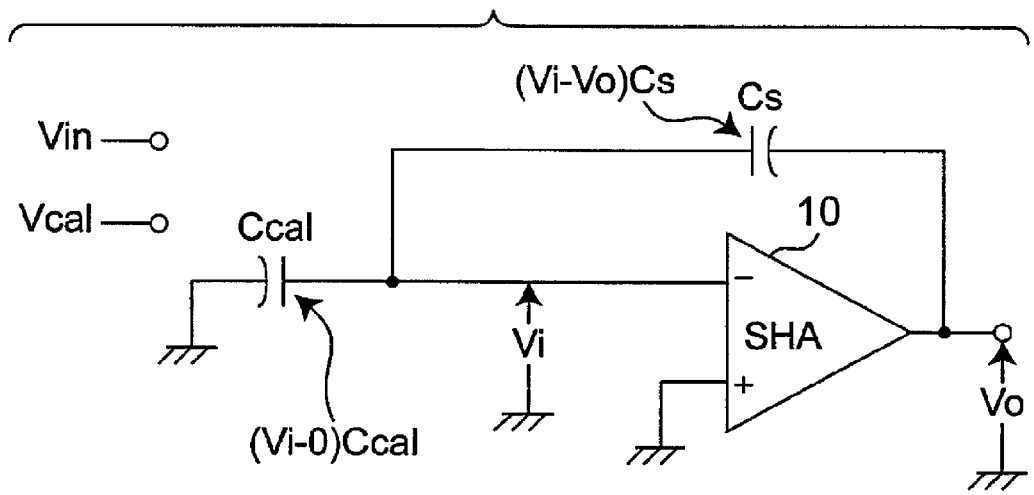
FIG. 11 is a schematic circuit diagram showing an operation in the holding phase of the sample hold circuit 1A of FIG. 7.

Next, the operation of the sample hold circuit 1A of FIG. 7 will be described below with reference to FIGS. 10 and 11. FIG. 10 is a schematic circuit diagram showing an operation in the sampling phase of the sample hold circuit 1A of FIG. 7, and FIG. 11 is a schematic circuit diagram showing an operation in the holding phase of the sample hold circuit 1A of FIG. 7. In FIGS. 10 and 11, only a half portion of the sample hold circuit 1A of FIG. 7 is shown for simplicity of explanation.

Referring to FIG. 10, the clock signals φ1 and φ1d become the high level in the sampling (tracking) phase of the sample hold circuit 1A, and the adder circuit of the sample hold circuit 1A tracks the calibration signal. At the end of the tracking, the clock signal φ1 first becomes the low level, and the clock signal φ1d subsequently becomes the low level. Assuming that the signal to be sampled is the analog input signal Vin and the calibration signal Vcal, then electric charges to be electrically charged in the top plates (electrodes indicated by the straight lines in FIGS. 10 and 11) of the capacitors Cs and Ccal are Vin×Cs and Veal×Ccal, respectively. Then, in the holding phase, the clock signals φ1 and φ1d become the low level, and the clock signal $\overline{\varphi 1}$ becomes the high level. Referring to FIG. 11, the bottom plates (electrodes indicated by the curved lines in FIGS. 10 and 11) of the capacitors Cs and Ccal are connected to the output terminal of the sample hold amplifier 10 and the common mode potential (ground potential), respectively. Using the law of conservation of charges, the output voltage of the sample hold amplifier 10 can be calculated according to the following Equations (1) to (4):

$$Q = -V_{in}C_s - V_{cal}C_{cal}, \tag{1}$$

$$Q_0 = (V_i - V_0)C_s + V_iC_{cal}, \tag{2}$$

$$Q = Q_0, \tag{3}$$

and $$V_0 = V_{in} + V_{cal}\frac{C_{cal}}{C_s} + V_i\left(1 + \frac{C_{cal}}{C_s}\right), \tag{4}$$

where Q and $Q_0$ are total sums of electric charges electrically charged in the top plates of Cs and Ccal in each of the tracking phase and the holding phase, Vo denotes the output voltage of the sample hold amplifier 10, and Vi denotes an offset voltage in the input voltage to the sample hold amplifier 10. Ideally, Vi is about (1/A)Vo when A denotes the gain of the amplifier 10. According to the Equation (4), the capacitor Ccal increases an error caused by the offset voltage Vi. However, because the capacitance of the calibration capacitor Ccal is set sufficiently smaller than the capacitance of the sampling capacitor Cs (Ccal<<Cs; and the former is, for example, at least two orders of magnitude smaller, i.e., 1/100) and the gain A of the amplifier 10 is normally very large (A>>1; A is, for example, equal to or larger than 100), the error is on the negligible level. Therefore, the Equation (4) is expressed simplified as the following Equation (5):

$$V_0 \approx V_{in} + V_{cal}\frac{C_{cal}}{C_s}. \tag{5}$$

As apparent from the Equation (5), the sample hold circuit 1A of FIG. 7 constitutes an adder circuit that adds the (Ccal/Cs)-fold calibration signal Vcal to the analog input signal Vin. The calibration capacitor Ccal should have a small value for several reasons. First, the chip area does not remarkably increase. Second, the dynamic range of the A/D converter apparatus is consequently not excessively reduced, and a comparatively large calibration voltage Vcal can be used. As the most important reason, the bandwidth of the adder circuit must be large in order to suppress the influence of mismatch to the minimum for the reason that the mismatch of the adder circuit between channels causes a measurement error.

Figure 12:
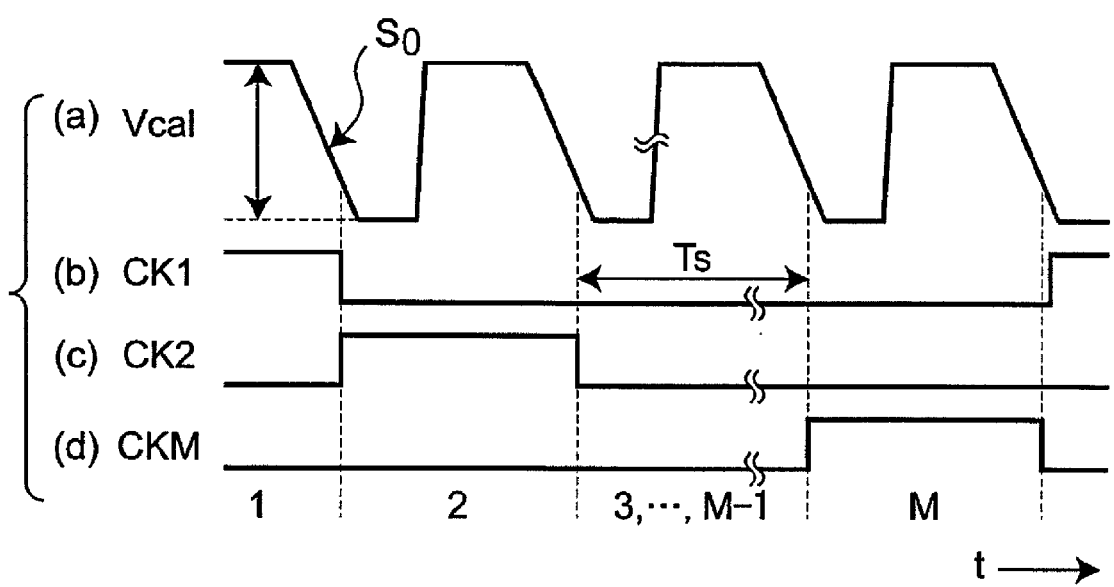
FIG. 12 is a timing chart of a ramp calibration signal Vh and clock signals CK1 to CKM used in the sample hold circuit 1A of FIG. 7.

Next, a novel clock skew calibration method in the time-interleaved A/D converter apparatus of the present preferred embodiment will be described below with reference to FIGS. 12 and 13. FIG. 12 is a timing chart of the ramp calibration signal Vh and the clock signals CK1 to CKM used in the sample hold circuit 1A of FIG. 7.

A direct method for calibrating the clock skew is a method for adjusting the clock phase. According to the researches (See, for example, the Non-Patent Document 7) conducted by the inventor and others, such a result that the skew after calibration is smaller than 1 pico-second is obtained. The circuit of FIG. 13, which self-calibrates the clock skew by using the sample hold circuit 1A that includes the novel adder circuit, is proposed. The clock skew amount is measured by using the ramp calibration signal Vcal and further using a signal obtained by low-pass filtering the differential signal between the output signals from the A/D converters 2-1 and 2-2 of the channels by a low-pass filter 5. If the clock skew amount is measured, the temporal time delay amounts of voltage-controlled delay circuits 13-1 and 13-2 of the channels are adjusted so as to suppress the clock skew to the minimum.

The clock skew is measured by using a ramp calibration signal that has a frequency identical to the sampling frequency. That is, since the ramp calibration signal has the frequency identical to the sampling frequency in the present preferred embodiment, the fact that the signal behaves as a DC value with an amount of clock skew every channel when it is sampled is utilized.

Referring to FIG. 12, the ramp calibration signal Vcal is sampled at the falling edges. Since the ramp calibration signal has the frequency identical to the sampling frequency, a calibration signal having an identical value is to be added to all the channels if no clock skew exists. When a clock skew exists, the calibration signals having different values are inputted. The clock skew can be measured by comparing the output signals from the different channels. In this case, the slope $S_o$ of the ramp calibration signal needs to have a magnitude sufficient for guaranteeing a calibration resolution.

Figure 13:
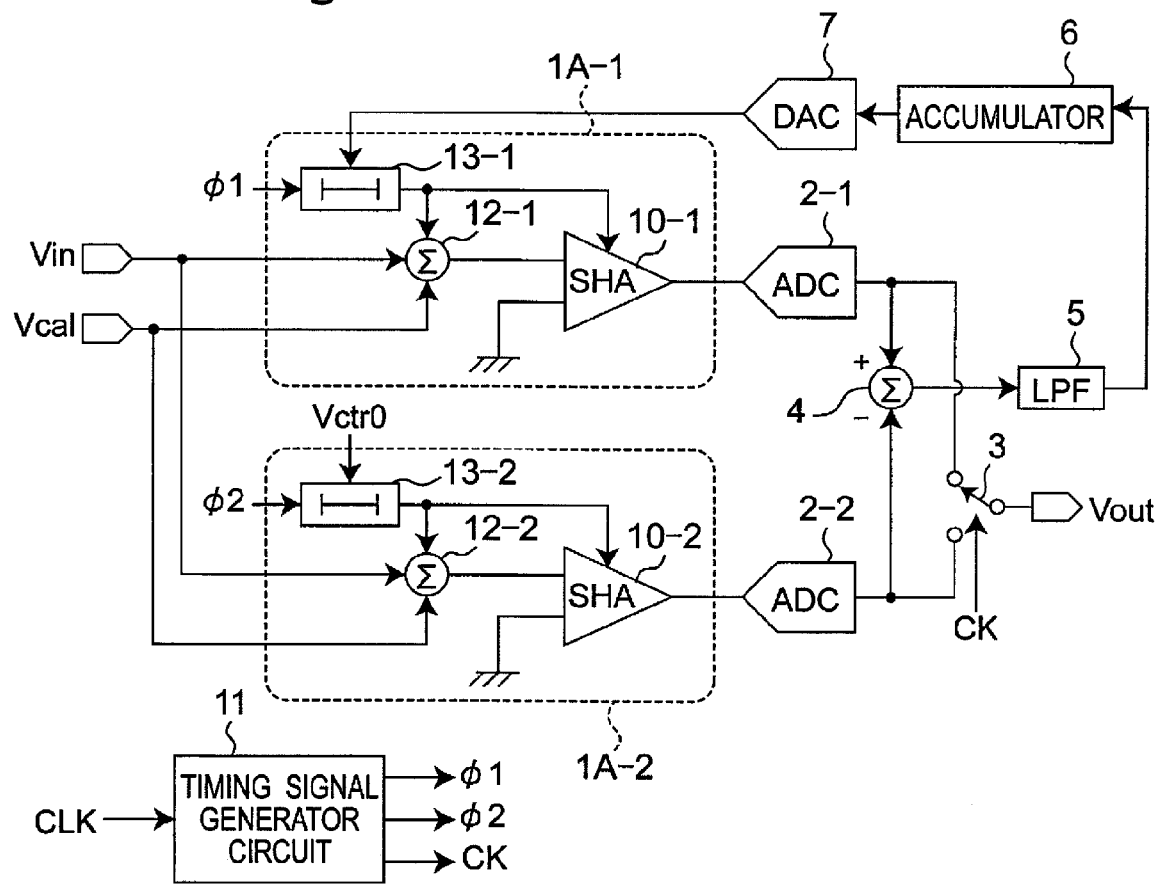
FIG. 13 is a block diagram showing a configuration of an A/D converter apparatus (M=2) that has a skew measurement circuit employing the sample hold circuit 1A of FIG. 7.

FIG. 13 is a block diagram showing a configuration of an A/D converter apparatus (M=2) that has a skew measurement circuit employing the sample hold circuit 1A of FIG. 7. In FIG. 13, it is assumed that the gain and offset mismatches in the sample hold circuits 1A-1 and 1A-2 have been calibrated by a well-known method. The calibration can be easily performed if the input signal Vin is set to zero, and the calibration can be executed by using a low-pass filter if the input signal Vin has a zero mean or average (See, for example, the Non-Patent Document 10).

Referring to FIG. 13, the sample-hold circuits 1A-1 and 1A-2 have a detailed configuration in a manner similar to that of, for example, FIG. 7 and are illustrated in a simplified form corresponding to the function in FIG. 13. It is noted that the voltage-controlled delay circuits 13-1 and 13-2 of the channels are not shown in FIG. 7 but additionally shown in FIG. 13. The timing signal generator circuit 11 generates and outputs clock signals $\phi1$ and $\phi2$ that are different from each other in each channel and a clock signal CK that is the logical sum of them based on the sampling clock signal CLK.

The sample hold circuit 1A-1 of the channel 1 is constituted by including a sample hold amplifier 10-1, an adder 12-1, and a voltage-controlled delay circuit 13-1. In the sample hold circuit 1A-1, the clock signal $\phi1$ is delayed by the voltage-controlled delay circuit 13-1 of which the amount of delay is controlled based on a control signal from the D/A converter 7, and thereafter, it is inputted as a timing signal for operational control to the adder 12-1 and the sample hold amplifier 10. The input signal Vin and the calibration signal Vcal are inputted to the adder 12-1, and the adder 12-1 adds together two signals inputted based on the timing signal from the voltage-controlled delay circuit 13-1 and outputs the resulting signal to the sample hold amplifier 10-1. Subsequently, the sample hold amplifier 10-1 amplifies a signal inputted based on the timing signal from the voltage-controlled delay circuit 13-1 and outputs the resulting signal to the A/D converter 2-1. The sample hold circuit 1A-2 of the channel 2 is constituted by including a sample hold amplifier 10-2, an adder 12-2, and a voltage-controlled delay circuit 13-2 and operates similar to the sample hold circuit 1A-2. It is noted that the voltage-controlled delay circuit 13-2 delays the clock signal $\phi2$ by a predetermined amount of delay corresponding to a control signal Vctr0 that has a predetermined fixed value, and thereafter, the resulting signal is outputted to the adder 12-2 and the sample hold amplifier 10-2.

The output signal from the sample hold amplifier 10-1 is A/D converted by the A/D converter 2-1, and thereafter, it is outputted to an adder 4 (this may be a subtractor) and the switch 3. The output signal from the sample hold amplifier 10-2 is A/D converted by the A/D converter 2-2, and thereafter, it is outputted to the adder 4 and the switch 3. The switch 3 is sequentially switched over to select the output signals in an order of the A/D converters 2-1 and 2-2 based on the clock signal CK from the timing signal generator circuit 11 in a manner similar to the case of the switch 3 of FIG. 1, and the digital output signal Vout of the A/D conversion result is outputted from the switch 3. On the other hand, the adder 4 subtracts the digital signal from the A/D converter 2-2, from the digital signal from the A/D converter 2-1 and outputs the differential signal of the subtraction result to an accumulator 6 via the low-pass filter 5 of digital processing. The accumulator 6 has a so-called amplifying function to accumulatively add together the inputted digital signals and output a resulting signal to the D/A converter 7. It is noted that the accumulator 6 constitutes an amplifier of a feedback loop circuit and may be configured of an amplifier in place of the accumulator 6. Further, the D/A converter 7 D/A converts the inputted digital signal into an analog voltage signal, and thereafter, it outputs the resulting signal as a control signal to the voltage-controlled delay circuit 13-1.

Figure 14:
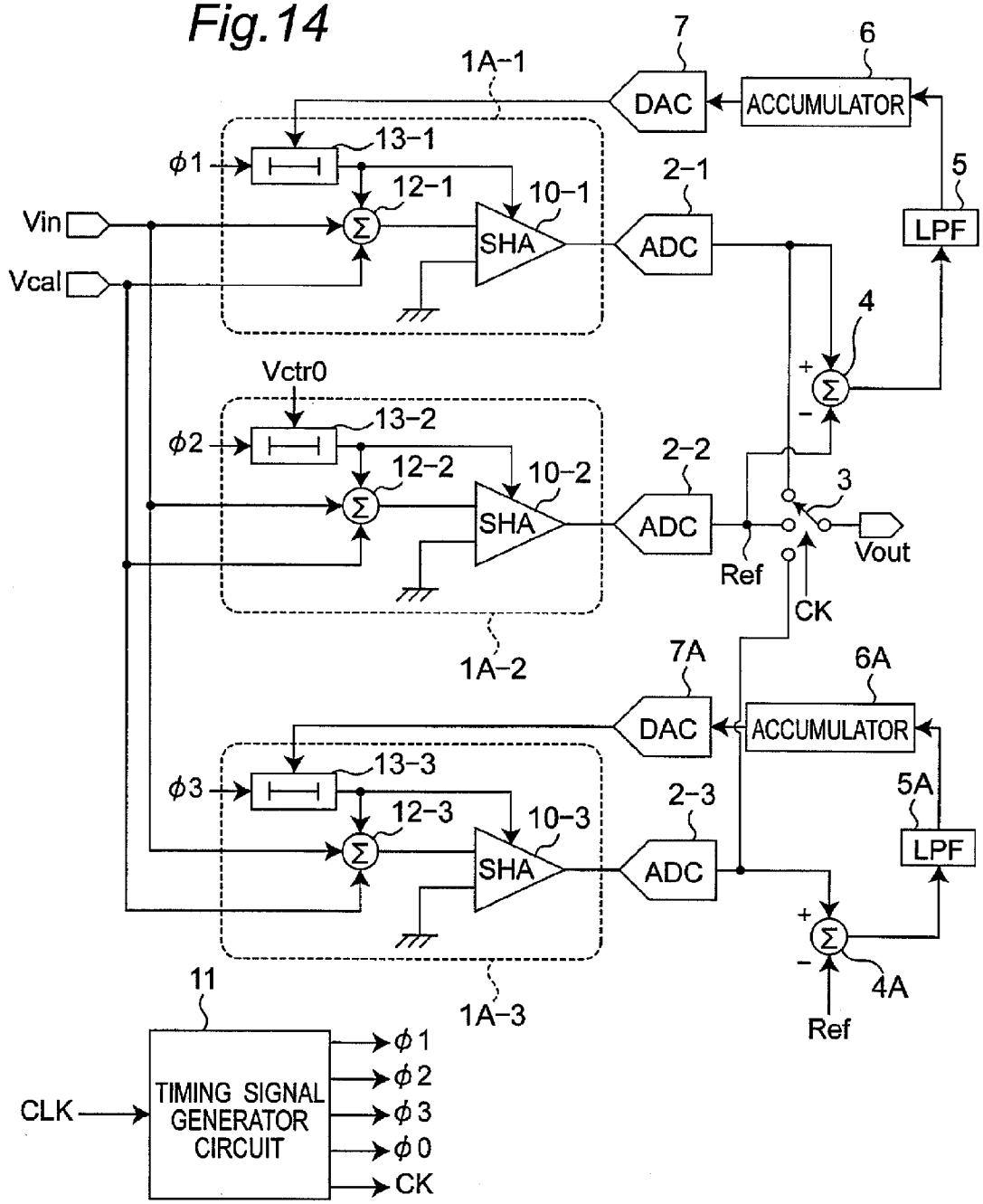
FIG. 14 is a block diagram showing a configuration of an A/D converter apparatus (M=3) that has a skew measurement circuit employing the sample hold circuit 1A of FIG. 7.
Figure 15:
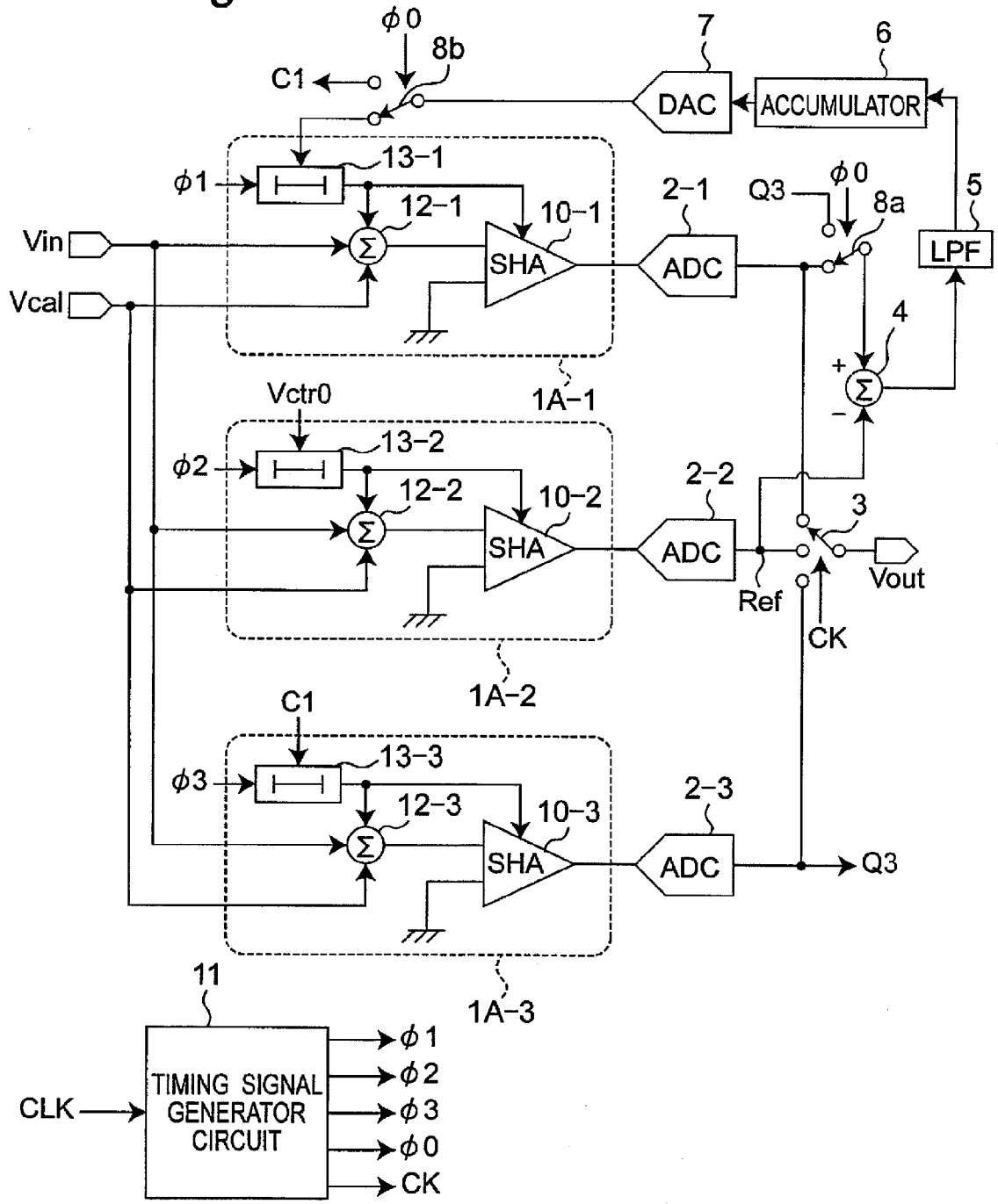
FIG. 15 is a block diagram showing a configuration of an A/D converter apparatus (M=3) that has a skew measurement circuit employing the sample hold circuit 1A of FIG. 7 according to a modified preferred embodiment of FIG. 14.

In the A/D converter apparatus (M=2) that has the skew measurement circuit employing the sample hold circuit 1A configured as above, one channel (e.g., the channel 2 of FIG. 13) in the time-interleaved A/D converter apparatus is set as a reference channel during calibration. The output signals (output signals from the A/D converters 2-1 and 2-2) from two channels are compared with each other, and a differential signal between the two output signals is outputted from the adder 4. In this case, the differential signal represents the information of the clock skew, and the differential signal is filtered by the low-pass filter 5. Thereafter, the output signal from the low-pass filter 5 is inputted to the accumulator 6, and the accumulator 6 amplifies the input signals by accumulative addition and outputs the resulting signal to the voltage-controlled delay circuit 13-1 via the D/A converter 7. In this case, the circuit from the A/D converters 2-1 and 2-2 via the adder 4, the low-pass filter 5, the accumulator 6 and the D/A converter 7 to the voltage-controlled delay circuit 13-1 constitutes the feedback loop circuit of the sample hold circuit 1A-1. The feedback loop circuit constitutes a self-calibration loop circuit that controls the A/D conversion processing of the sample hold circuit 1A-1 so as to adjust the phase of the sampling clock until the clock skew is minimized. Since the self-calibration loop circuit (proportional integration loop (PI loop) circuit)) is configured, the value of the slope $S_0$ of the ramp calibration signal Vcal is set in consideration of the operation time of the self-calibration loop circuit. Although the present preferred embodiment is described by using the time-interleaved A/D converter apparatus of two channels, the present invention is not limited to this but allowed to be easily applied to a time-interleaved A/D converter apparatus of a plurality M of channels by calibrating the reference channel and other channels two by two. Referring then to FIGS. 14 and 15, a modified preferred embodiment in which M=3 is described.

FIG. 14 is a block diagram showing a configuration of an A/D converter apparatus (M=3) that has a skew measurement circuit employing the sample hold circuit 1A of FIG. 7. The A/D converter apparatus of FIG. 14 is characterized by further including a circuit for the clock skew calibration of a channel 3 as compared with the A/D converter apparatus of FIG. 13 and, in concrete, further including a sample hold circuit 1A-3 of the channel 3, an A/D converter 2-3, an adder 4A, a low-pass filter 5A, an accumulator 6A, and a D/A converter 7A. In the circuit of FIG. 14, the clock skew of the channel 1 is calibrated by using the output signal of the channel 2 as a reference signal Ref, and the clock skew of the channel 3 is calibrated by using the output signal of the channel 2 as a reference signal Ref. That is, the clock skew calibration is performed by using the channel 2 as a master and using the channels 1 and 3 as slaves.

Although the clock skew calibration is performed by using the channel 2 as a master and using the channels 1 and 3 as slaves in the circuit of FIG. 14, the present invention is not limited to this but allowed to perform clock skew calibration by using the channel 1 as a master and using the channels 2 and 3 as slaves.

FIG. 15 is a block diagram showing a configuration of an A/D converter apparatus (M=3) that has the skew measurement circuit employing the sample hold circuit 1A of FIG. 7 according to a modified preferred embodiment of FIG. 14. The circuit of FIG. 15 is characterized in that the circuit scale can be reduced by sharing the circuit from the adder 4 to the D/A converter 7 by the channels 1 and 3 as compared with the circuit of FIG. 14. That is, the clock skew calibration is performed by using the channel 2 as a master and using the channels 1 and 3 as slaves in the circuit of FIG. 15, and switches 8a and 8b controlled by the timing signal $\phi 1$ are provided therefor in order to execute calibrations in different periods of the calibration period of the clock skew of the channel 1 and the calibration period of the clock skew of the channel 2.

Although the clock skew calibration is performed by using the channel 2 as a master and using the channels 1 and 3 as slaves in the circuit of FIG. 15, the present invention is not limited to this but allowed to perform clock skew calibration by using the channel 1 as a master and using the channels 2 and 3 as slaves.

IMPLEMENTAL EXAMPLES

Next, simulations were conducted on the time-interleaved A/D converter apparatus of FIG. 13 by the inventor and others. The method and results will be described below.

The simulations were conducted by modeling of all the modules by Verilog-A hardware description language except for the fact that the sample hold circuit 1A of the adder circuit of the present preferred embodiment was constituted by including a hardware circuit. The calibration was on the foreground, and the input signal was set to zero. The sampling frequency was 50 MHz, and an initial clock skew was set to 10 pico-seconds. According to the simulation results, the voltage-controlled delay circuits 13-1 and 13-2 ideally becomes an identical delay time, i.e., a delay time of, for example, 51.2 pico-seconds. The clock signal $\phi 2$ was preparatorily intentionally shifted by 10 pico-seconds. The sampling clock in the channel 2 reaches 10 pico-seconds earlier than an ideal clock otherwise.

Figure 16:
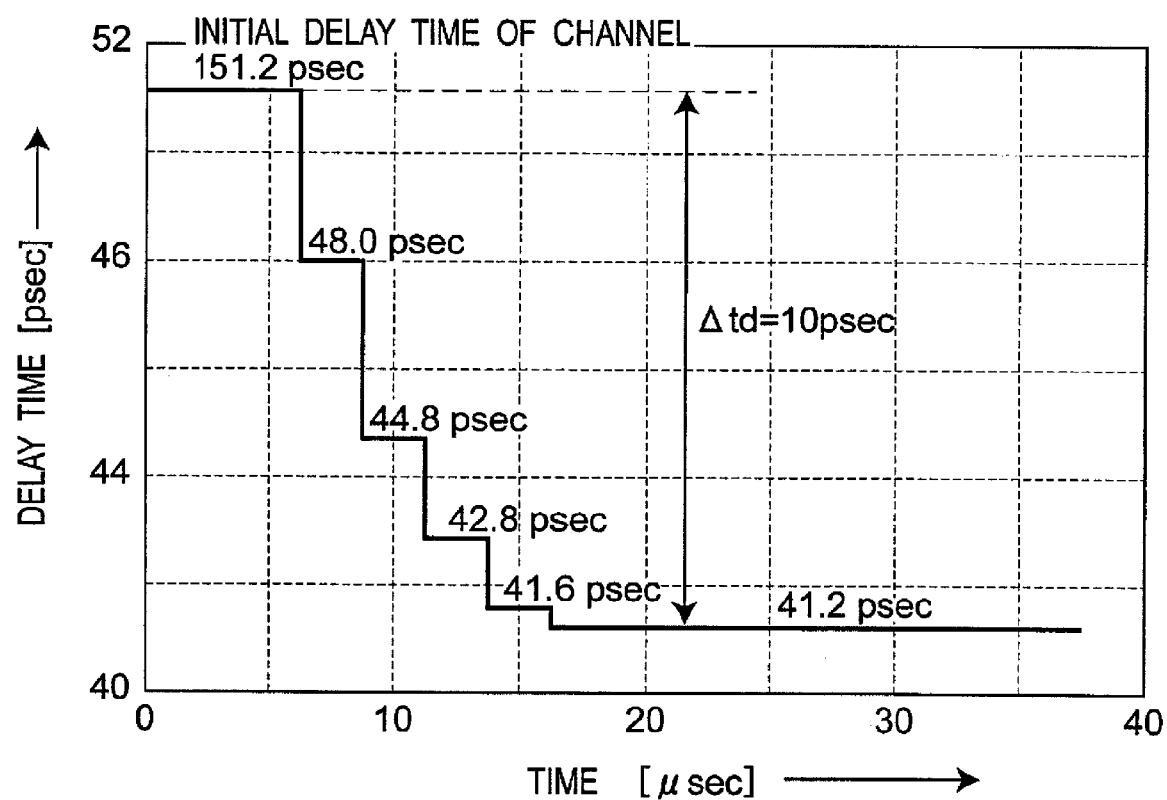
FIG. 16 is a graph showing a temporal transition of the delay time of a channel 1 according to simulation results of the A/D converter apparatus of FIG. 13.

FIG. 16 is a graph showing a temporal transition of the delay time of the channel 1 according to the simulation results of the A/D converter apparatus of FIG. 13. In FIG. 16, the x-axis represents the elapsed time of simulation, and the y-axis represents the delay time caused by the voltage-controlled delay circuit 13-1 of the channel 1. As apparent from FIG. 16, it could be discovered that the calibration loop converged after several calibration steps, and the delay time of the voltage-controlled delay circuit 13-1 was adjusted by 10 pico-seconds. At this point of time, the delay time is 41.2 pico-seconds as shown in FIG. 16, and the sampling clock of the channel 1 becomes 10 pico-seconds earlier than the ideal clock, and this means that the preset clock skew has been compensated for.

As described above, according to the present preferred embodiment, the practical novel adder circuit is proposed which is capable of inputting the calibration signal to the input signal with almost no interference with the input signal. If the ramp calibration signal is used as the calibration signal, the clock skew amount can accurately be measured by the adder circuit of the present preferred embodiment.

INDUSTRIAL APPLICABILITY

As described above, according to the sample hold circuit of the present invention, the sample hold circuit includes the adder circuit that adds the ramp calibration signal to the input signal by inputting the ramp calibration signal generated to have a frequency identical to that of the sampling clock signal and a predetermined slope based on the sampling clock signal to the sample hold amplifier via the calibration capacitor having a capacitance smaller than the capacitance of the sampling capacitor. The calculator device calculates the differential signal between the respective output signals from the respective A/D converters. With this arrangement, the ramp calibration signal is sampled as a DC value corresponding to the amount of clock skew between the sample hold circuits when it is sampled by the sample hold circuit, and the differential signal represents the amount of clock skew, and this leads to measurement of the amount of clock skew. Accordingly, this leads to the provision of the sample hold circuit capable of measuring the amount of clock skew more extremely simply and more stably than those of the prior art technique without any reference voltage source but inputting the calibration signal. In addition, the present invention can provided the A/D converter apparatus that employs the same sample hold circuit.

Moreover, the phase of the clock signal can be adjusted so as to minimize the clock skew based on the measured clock skew. In particular, the A/D converter apparatus having the circuit for measuring the amount of clock skew includes the small calibration capacitor and the switch device that branches from the sample hold circuit. The additional calibration capacitor, which slightly increases the chip area, does not exert a large influence on the other circuit area. Therefore, a clock skew measurement circuit can be configured with an extremely small area.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sample hold circuit which includes a sampling capacitor and a sample hold amplifier, and which operates to sample and hold an input signal by using a switched capacitor, the sample hold circuit comprising:

an adder circuit for adding a ramp calibration signal to the input signal, by inputting the ramp calibration signal generated to have a frequency identical to that of a sampling clock signal and a predetermined slope based on the sampling clock signal, into a sample hold amplifier via a calibration capacitor having a capacitance smaller than that of the sampling capacitor.

2. A time-interleaved A/D converter apparatus comprising:

at least two first and second sample hold circuits, each of the sample hold circuit including a sampling capacitor and a sample hold amplifier, and operating to sample and hold an input signal by using a switched capacitor, each of the sample hold circuit comprising an adder circuit for adding a ramp calibration signal to the input signal, by inputting the ramp calibration signal generated to have a frequency identical to that of a sampling clock signal and a predetermined slope based on the sampling clock signal, into a sample hold amplifier via a calibration capacitor having a capacitance smaller than that of the sampling capacitor;

at least two first and second A/D converters for A/D converting an output signal from each of the sample hold circuits;

a switch device for outputting an A/D converted signal obtained through A/D conversion of the input signal, by outputting output signals from the respective A/D converters at timings different from each other; and a calculator device for calculating a differential signal between the output signals from the respective A/D converters, wherein, when the ramp calibration signal is sampled by the sample hold circuit, the ramp calibration signal is sampled as a DC value corresponding to a clock skew amount between the sample hold circuits, and wherein the differential signal represents the clock skew amount, thereby measuring the clock skew amount.

3. The A/D converter apparatus as claimed in claim 2, wherein the first sample hold circuit is operated by a predetermined first sampling clock signal, and the second sample hold circuit is operated by a second sampling clock signal, and wherein the A/D converter apparatus further comprises a calibration loop circuit including a delay device for adjusting a phase of the second sampling clock signal based on the differential signal so that the clock skew amount is minimized.

4. The A/D converter apparatus as claimed in claim 3, wherein the calibration loop circuit further comprises:

a low-pass filter for low-pass filtering the differential signal; and an amplifier for amplifying an output signal from the low-pass filter, and outputting a low-pass filtered signal to the delay device.

* * * * *